United States Patent [19]

Kumagai

[11] 4,126,828

[45] Nov. 21, 1978

[54] INTERMODULATION ANTIINTERFERENCE DEVICE FOR SUPERHETERODYNE RECEIVER

[75] Inventor: Morio Kumagai, Tokyo, Japan

[73] Assignee: Trio Kabushiki Kaisha, Tokyo, Japan

[21] Appl. No.: 819,044

[22] Filed: Jul. 26, 1977

[30] Foreign Application Priority Data

Jul. 31, 1976 [JP] Japan .................................. 51-91577
Jul. 31, 1976 [JP] Japan .................................. 51-91578

[51] Int. Cl.² .............................................. H04B 1/10
[52] U.S. Cl. ..................... 325/472; 325/377; 325/404; 325/435; 325/474
[58] Field of Search .................. 325/62, 65, 307, 368, 325/369, 371, 377, 378, 398–401, 404, 472, 473–476, 434–436, 405, 408, 411, 362, 344, 345

[56] References Cited

U.S. PATENT DOCUMENTS

| | | | |
|---|---|---|---|
| 2,959,674 | 11/1960 | O'Meara | 325/401 |
| 3,167,761 | 1/1965 | Parquier | 325/476 |
| 3,396,395 | 8/1968 | Ball et al. | 325/435 |
| 3,619,786 | 11/1971 | Wilcox | 325/362 |
| 3,622,891 | 11/1971 | Leland | 325/472 |

Primary Examiner—Robert L. Griffin
Assistant Examiner—Jin F. Ng
Attorney, Agent, or Firm—Gerald J. Ferguson, Jr.; Joseph J. Baker

[57] ABSTRACT

An intermodulation antiinterference circuit for a superheterodyne receiver having a receiving antenna comprising a first high frequency amplifying circuit responsive to the receiving antenna; a local oscillating circuit; a first frequency conversion circuit responsive to the first high frequency amplifying circuit and the local oscillating circuit; a variable attenuation circuit disposed between the receiving antenna and the first frequency conversion circuit; a nonlinear circuit responsive to the receiving antenna having less linearity than the first high frequency amplifying circuit; a second frequency conversion circuit responsive to the local oscillating circuit and the nonlinear circuit; a comparison circuit responsive to the first and second frequency conversion circuits for generating an output when the output of the second frequency conversion circuit is greater than the output of the first frequency conversion circuit; and means for changing the attenuation of the attenuating circuit.

11 Claims, 8 Drawing Figures

INTERMODULATION ANTIINTERFERENCE DEVICE FOR SUPERHETERODYNE RECEIVER

BACKGROUND OF THE INVENTION

This invention relates to an intermodulation antiinterference device for a superheterodyne receiver. It is a device to prevent the intermodulation interference generated in a high frequency amplifying circuit and a mixing circuit in a receiver. In other words, it detects the intermodulation interference and reduces the intermodulation interference by controlling an attenuating circuit.

When multiple signals having frequencies within the band of the high frequency amplifying circuit enter simultaneously, for example, as in the United States, when VHF band FM broadcasting stations are positioned every 400 KHz, marked intermodulation interference appears when the signals of a neighboring station or next to a neighboring station are large, and the desired signals are disturbed. This intermodulation interference increases when the linearity of the active element of the high frequency amplifying circuit and the mixing circuit is insufficient; when the gain from the antenna terminal to the mixing circuit is high; and when the Q of the selective tuning circuit in the high frequency circuit is low. Therefore, various methods have been devised to eliminate the above-mentioned causative factors by using a low noise, low-gain nonlinear active element or by increasing the Q of the selective tuning circuit.

However, it is impossible in actuality to increase the linearity of the active element of the high frequency amplifying circuit to a sufficient level to oppose a high amplitude interfering wave. As for the active element of the mixing circuit, due to the fact that the mixing circuit relies on the nonlinearity of the active element, the use of an active element with good linearity cancels the primary objective of frequency conversion gain.

Therefore, there are conflicting requirements involved in the prevention of intermodulation interference. When two interfering waves are present near the desired receiving point, and one of the interfering waves is large, the level of the other interfering wave must be lowered considerably. The method for raising the Q in the high frequency circuit is also limited. Another conceivable method is to charge a series resonant circuit between the input terminals of the antenna and the receiver. However, unless a narrow band cyrstal filter that passes only the desired signals is used, there is a limit to the narrowing of the band of a series resonant circuit; and if a crystal filter is used, there is still a problem in that the receiving frequency cannot be varied.

Thus, various measures have their limitations and are unsatisfactory.

SUMMARY OF THE INVENTION

This invention was devised in view of the above-mentioned facts, and its purpose is to provide an intermodulation antiinterference device for a superheterodyne receiver that detects intermodulation interference and reduces the intermodulation interference by regulating the attenuation of the attenuating circuit between the high frequency amplifying circuit and the antenna.

This objective may be achieved according to this invention by a first high frequency amplifying circuit connected to the receiving antenna through an attenuating circuit and a second high frequency amplifying circuit directly connected from the receiving antenna and having less linearity than that of the first high frequency amplifying circuit. The first and second amplifying circuits are connected to respective mixing circuits which mix the outputs of the respective high frequency amplifying circuits using a common local oscillating circuit. First and second intermediate frequency amplifying circuits amplify the outputs of the respective mixing circuits and a comparison circuit compares the outputs of the respective intermediate frequency amplifying circuits. The output of the comparison circuit is used to automatically or manually increase the dampening factor of the attenuating circuit.

The characteristics of this invention are intermodulation interfering signals are detected by comparing the outputs of the two intermediate frequency amplifying circuits, a switch circuit is operated by the output of the comparison circuit and the dampening factor of the attenuating circuit is changed by amplifying the output of the comparison circuit or by manual operation.

In another embodiment of the invention, the foregoing objective may be achieved by providing a receiver having an attenuating circuit to attenuate the output of the receiving antenna; a high frequency amplifying circuit to amplify the output of the attenuating circuit; a first mixing circuit to mix the output of the high frequency amplifying circuit and the output of a local oscillating circuit; and a first intermediate frequency amplifying circuit to amplify the output of the first mixing circuit. The foregoing circuitry is provided with a nonlinear circuit that amplifies the output of the high frequency amplifying circuit; a second mixing circuit that mixes the output of the nonlinear circuit and the output of the local oscillating circuit; a second intermediate frequency amplifying circuit that amplifies the output of the second mixing circuit; a comparison circuit using as in an input the outputs of the first and second intermediate frequency amplifying circuits before amplitude limiting thereof and generating an output when the output of the second intermediate frequency amplifying circuit is greater than the output of the first intermediate frequency amplifying circuit, and a display circuit that is lighted by the output of the comparison circuit. The attenuation of the attenuating circuit is controlled by observing the display of the display circuit.

DETAILED DESCRIPTION OF PREFERRED EMBODIMENTS

Figure 1:
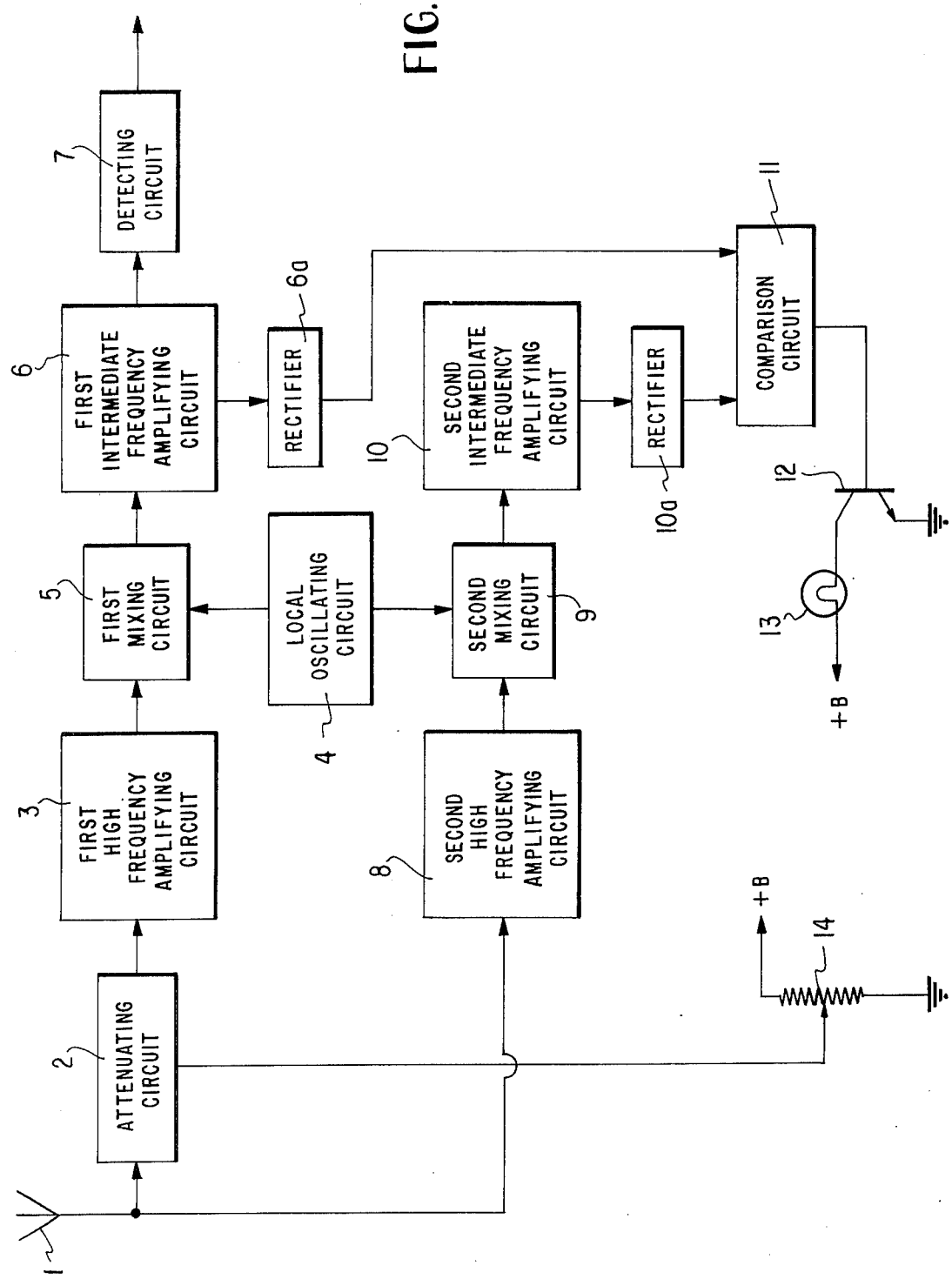
FIGS. 1 through 4 are block diagrams of different working embodiments of this invention.

Referring to FIG. 1, 1 is a receiving antenna. An attenuating circuit 2 dampens the output of antenna 1. A first high frequency amplifying circuit 3 amplifies the output of attenuating circuit 2. A first mixing circuit 5 mixes the output of the first high frequency amplifying circuit and the output of a local oscillating circuit 4. A first intermediate frequency amplifying circuit 6 amplifies the output of first mixing circuit 5. A detecting circuit 7 detects the output of first intermediate frequency amplifying circuit 6. The foregoing circuit group normally comprises a superheterodyne receiver.

In addition, the device has the following second circuit group.

The second circuit group comprises a second high frequency amplifying circuit 8 where the signal directly enters from antenna 1 without passing through the attenuating circuit. Circuit 8 has less linearity and a higher intermodulation interference output level than first high frequency amplifying circuit 3. A second mixing circuit 9 mixes the output of second high frequency amplifying circuit 8 and the output of local oscillating circuit 4. A second intermediate frequency amplifying circuit 10 amplifies the output of second mixing circuit 9 with equal or less linearity and a higher intermodulation interference output level than that of first intermediate frequency amplifying circuit 6. A comparison circuit 11 uses as its input the unlimited amplitudes of first intermediate frequency amplifying circuit 6 after rectification by rectifier 6a and second intermediate frequency amplifying circuit 10 after rectification by rectifier 10a.

Comparison circuit 11 generates an output when the output level of second intermediate frequency amplifying circuit 10 is higher than the output level of the first intermediate frequency amplifying circuit 6. The output of comparison circuit 11 is amplified by an amplifying element 12. The circuit is connected to a display element 13, for example, a luminous diode disposed on the surface of the receiver. 14 is a variable resistor that changes the dampening factor of attenuating circuit 2.

The output of first intermediate frequency amplifying circuit 6 inputted to comparison circuit 11 is set so that, when the attenuation of the attenuating circuit 2 is zero, it equals or is greater than the output of second intermediate frequency amplifying circuit 10 when the desired signal is received. The output of second intermediate frequency amplifying circuit 10 is set so that when an intermodulation interfering signal enters, it will be higher than the output of first intermediate frequency amplifying circuit 6 due to the increased interfering wave output caused by the second high frequency amplifying circuit 8 and the second mixing circuit 9.

The transfer characteristics of an active circuit can be expressed by the power series $I = a_0 + a_1x + a_2x^2 + a_3x^3 + \ldots$. When the two inputs, $e_1 = A \cos\omega_A t$ and $e_2 = B \cos\omega_B t$ are added, the circuit generates multiple frequency signals at intervals of the frequency difference between $e_1$ and $e_2$ where $x = A \cos\omega_A t + B \cos\omega_B t$. Of these, the third order intermodulations generated from the third term are the problem for intermodulation interference. Their values are $\frac{3}{4} a_3 A^2 B \cos (2\omega_A - \omega_B)t$ and $\frac{3}{4} a_3 AB^2 \cos (2\omega_B - \omega_A)t$. This indicates that the intermodulation interference output is increased by 3 db when the gains of the $e_1$ and $e_2$ signals are increased by 1 db. On the contrary, if the receiver were subjected to intermodulation interference and the interference output were 20 db, the interference output can be made 0 db by lowering the level of the interfering signal input by approximately 7 db.

The operation of FIG. 1 is explained below.

When the receiver is receiving only the desired signal, the output level of first intermediate frequency amplifying circuit 6 inputted to comparison circuit 11 is greater than the output level of second intermediate frequency amplifying circuit 10, and comparison circuit 11 does not generate an output signal. Consequently, the luminous indicator diode 13 does not illuminate. The attenuation of attenuating circuit 2 need not be changed.

When two interfering signals alone enter through antenna 1 causing an intermodulation output at the first and second intermediate frequency amplifying circuits 6 and 10, the output level of second intermediate frequency amplifying circuit 10 entering comparison circuit 11 is greater than the output level of first intermediate frequency amplifying circuit 6 and an output is generated at comparison circuit 11. Luminous diode 13 is illuminated, thus indicating the presence of intermodulation interference. In this case, intermodulation is reduced by increaseing the attenuation of the attenuating circuit by regulating the variable resistor 14. As mentioned above, the interference output level can be reduced by 3 db at the output of first intermediate frequency amplifying circuit 6 when the interfering signal level is reduced by 1 db with attenuating circuit 2.

Next, when two interfering signals enter through antenna 1 along with the desired signals and when the output level of first intermediate frequency amplifying circuit 6 caused by the desired signals is higher than the output level of second intermediate frequency amplifying circuit 10, the comparison circuit 11 has no output and luminous indicator diode 13 is not illuminated. Thus, the attenuation of attenuating circuit 2 need not be regulated. When the interference output is high, the output level of second intermediate frequency amplifying circuit 10 increases the intermodulation because of the nonlinearity of second high frequency amplifying circuit 8 and it becomes greater than the output level of first intermediate frequency amplifying circuit 6. Comparison circuit 11 thus generates output signals and luminous indicator diode 13 lights. In this case, the intermodulation output is reduced by increasing the attenuation of the attenuating circuit 2 by regulating variable resistor 14. For example, is order to improve the intermodulation interference by 20 db, attenuating circuit 2 is dampened by approximately 7 db, whereby the desired signal output is also reduced by approximately 7 db, but the intermodulation interference output is reduced by 20 db to make reception of the desired signal possible.

According to this working embodiment, an intermodulation antiinterference device that drastically reduces intermodulation interference and enables the reception of desired signals is made possible by manually dampening the output of the attenuating circuit when the luminous indicator diode lights, that is, when intermodulation interference is present.

Figure 2:
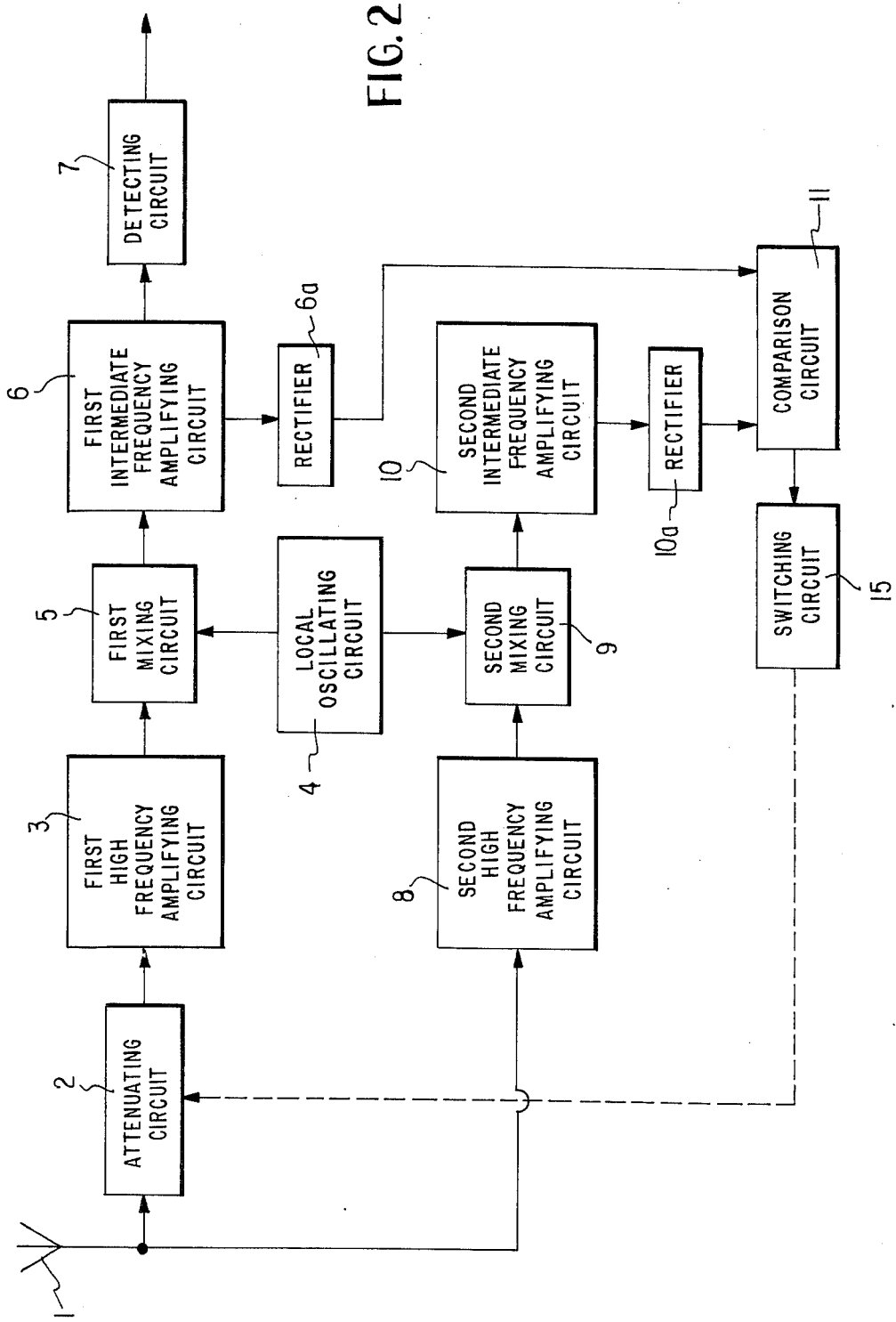

Next, a working embodiment of FIG. 2 is explained. Here, the same numbers are used for the same circuits as in FIG. 1. As shown in FIG. 2, the construction of the first circuit group and that of the second circuit group is exactly the same in this embodiment as in FIG. 1. Instead of amplifying element 12 and luminous indicator diode 13 shown in FIG. 1, a switching circuit 15 than amplifies the output of comparison circuit 11 and changes the attenuation of attenuating circuit 2 is connected to comparison circuit 11.

The operation and setting of this example are exactly the same as in the FIG. 1 embodiment for respective circuits that are identical. Switching circuit 15 is operated by the output of comparison circuit 11. It attenuates the output of the antenna to a fixed attenuation predetermined for attenuating circuit 2, and is inputted to first high frequency amplifying circuit 2.

When the receiver is receiving a desired signal, as in the case of the invention shown in FIG. 1, the comparison circuit does not operate; the switching circuit 15 does not switch attenuating circuit 2; and attenuation from the attenuating circuit remains at zero.

When two interfering signals enter through the antenna 1, as in the case of the FIG. 1 example, the comparison circuit generates an output, the switching circuit 15 switches the attenuation of the attenuating circuit 2 to the predetermined value and reduces the input of first high frequency amplifying circuit 3. The switching enables, for example, a 3 db reduction in the output of first intermediate frequency amplifying circuit 6 when 1 db reduction takes place in the attenuating circuit 2.

When two interfering signals enter through antenna 1 along with the desired receiving signals, and when the output level of first intermediate frequency amplifying circuit 6 caused by the desired signals is higher than the output level of second intermediate frequency amplifying circuit 10, the comparison circuit 11 generates no output. The attenuation is not changed, but remains at zero. When the interfering signal is high and when the output level of second intermediate frequency amplifying circuit 10 is higher than the output level of first intermediate frequency amplifying circuit 6 due to nonlinearity of second high frequency amplifying circuit 8, comparison circuit 11 generates an output and switching circuit 15 driven to dampen the attenuation of attenuating circuit 2 to the predetermined value.

As described above, according to the working embodiment of FIG. 2, switching circuit 15 is driven by the output of comparison circuit 11, instead of the amplifying element and indicator diode of FIG. 1, and the attenuation of attenuating circuit 2 can be automatically switched to a predetermined value.

Figure 3:
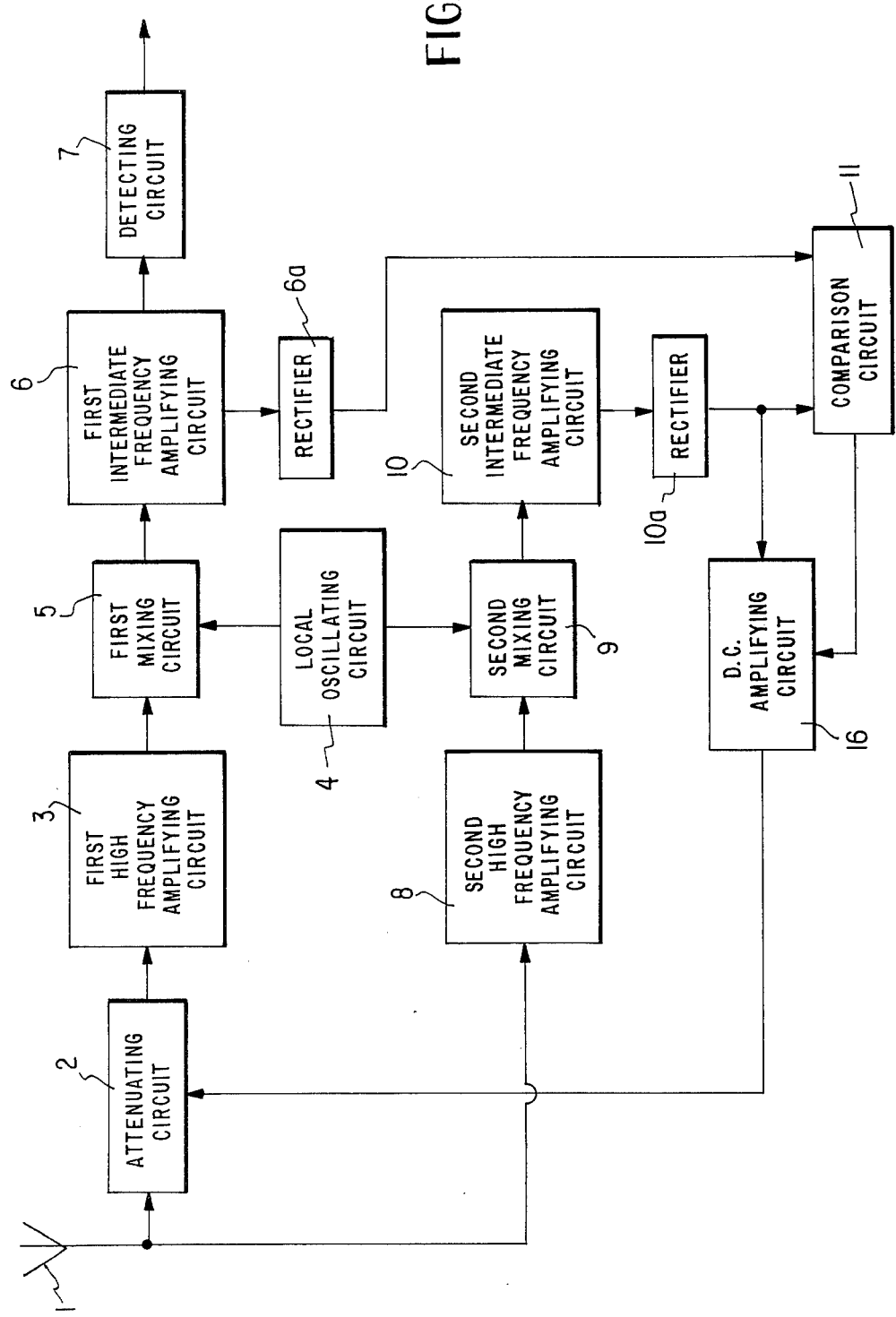

FIG. 3 shows still another working embodiment. In FIG. 3, the same markings are used for the same circuits as in FIG. 2. In comparing the working embodiment shown in FIG. 3 with that of FIG. 2, the differences are that the attenuating circuit in the series 1 circuit group is changed to a voltage control type, and without changing the second circuit group, switching circuit 15 is replaced with a D.C. amplifier 16. D.C. amplifier 16 outputs only when comparison circuit 11 generates an output by amplifying the output of second intermediate frequency amplifying circuit 10 before amplitude limiting thereof and regulates the attenuation of attenuating circuit 2.

Other construction and setting details of each circuit are exactly the same as in the examples of FIGS. 1 and 2.

The operation up to the time when comparison circuit 11 generates an output is also the same as in FIGS. 1 and 2. When intermodulation interference occurs, (that is, only when comparison circuit 11 is generating an output) the output of second intermediate frequency amplifying circuit 10 is amplified; the attenuation of attenuating circuit 2 is changed; and the input of first high frequency amplifying circuit 3 is changed.

In the case of FIG. 3, the intermodulation interference output can be continually changed according to the interfering signal input. When the desired signal and the interfering signal are simultaneously inputted into the antenna, optimum attenuation can be obtained without dampening the desired signal any more tha necessary.

Figure 4:
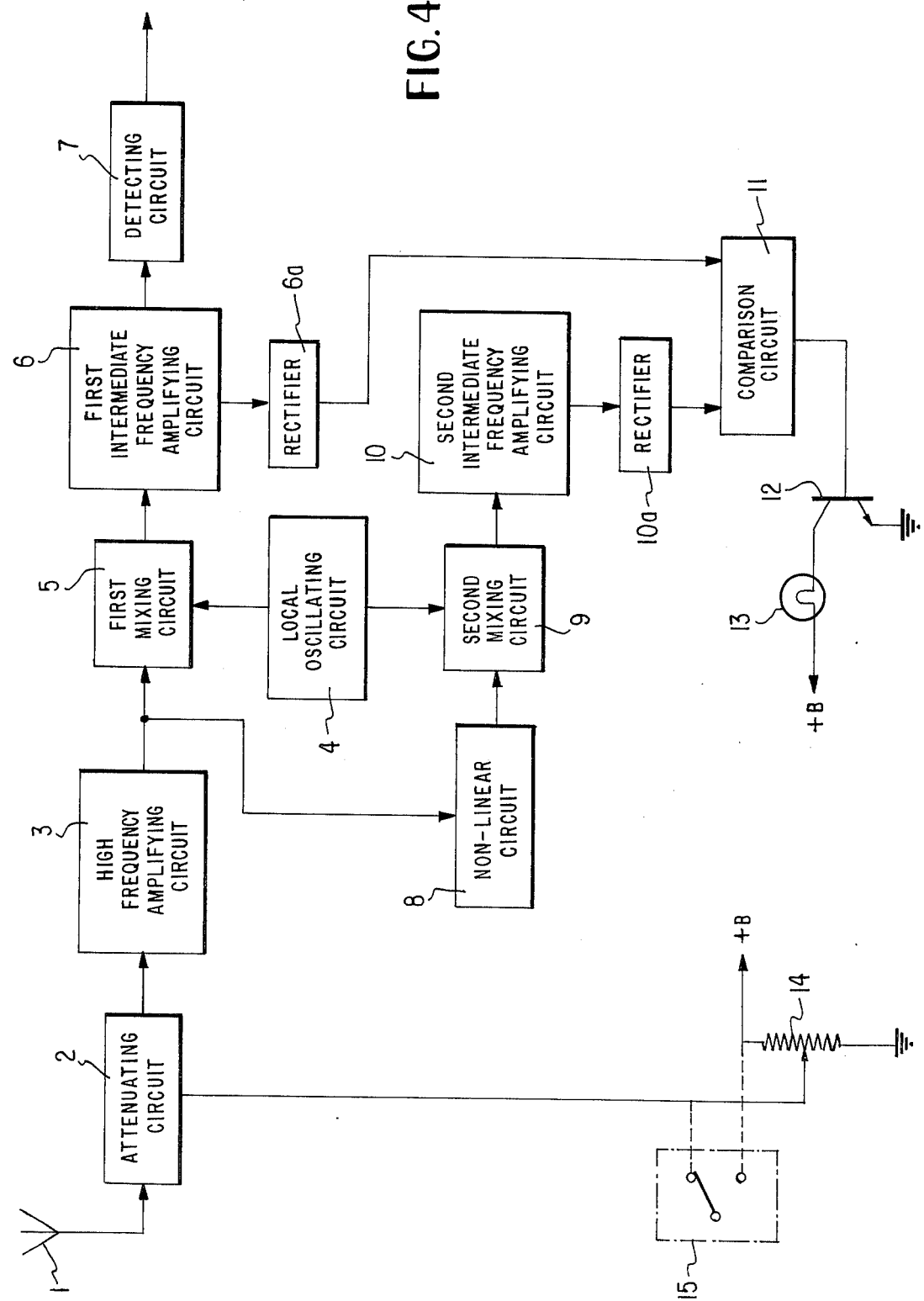

In FIG. 4, 1 is the receiving antenna. The superheterodyne receiver comprises an attenuating circuit 2 that attenuates the output of antenna 1; a high frequency amplifying circuit 3 that amplifies the output of attenuating circuit 2; a first mixing circuit 5 that mixes the output of high frequency amplifying circuit 3 and the output of a local oscillating circuit 4; a first intermediate frequency amplifying circuit 6 that amplifies the output of first mixing circuit 5; and a detecting circuit 7 that detects the output of the first intermediate frequency amplifying circuit.

Further connections to the basic receiver are a nonlinear circuit 8 having as its input the output of high frequency circuit 3; a second mixing circuit 9 that mixes the output of nonlinear circuit 8 and the output of local oscillating circuit 4; a second intermediate amplifying circuit 10 that amplifies the output of second mixing circuit 9; a comparison circuit 11 using as its input the outputs of first and second intermediate frequency amplifying circuits 6 and 10 before amplitude limiting thereof; and an amplifying element 12 that lights a display lamp 13.

The intermodulation characteristic of second mixing circuit 9 is either identical to or inferior to the characteristic of first mixing circuit 5. The output of first intermediate frequency amplifying circuit 6 inputted to comparison circuit 11 is set so that, when the attenuation of attenuating circuit 2 is zero, it is greater than the output of second intermediate frequency amplifying circuit 10 when the desired signal is being received. Its output upon reception of an intermodulation interfering wave is set so that the output of second intermediate amplifying circuit 10 would be the greater. The output of comparison circuit 11 is set so that it is generated only when the output of second intermediate frequency amplifying circuit 10 is greater than the output of the first intermediate frequency amplifying circuit.

14 indicates the volume control element for controlling the dampening factor of attenuating circuit 2 and 15 is a change-over switch that switches the said dampening factor to zero or to the dampening factor of volume control element 14.

The operation of the FIG. 4 embodiment is explained below. When the receiver is receiving only the desired signals, the output level of first intermediate frequency amplifying circuit 6 inputted to comparison circuit 11 is greater than the output level of second intermediate frequency amplifying circuit 10, and comparison circuit 11 does not generate an output signal. Consequently, lamp 13 of the display circuit does not light. In this case, the volume control element 14 of attenuating circuit 2 is not regulated, but attenuation is left as is.

When two interfering signals alone enter through antenna 1, causing an intermodulation output at first and second intermediate frequency amplifying circuits 6 and 10, the output level of second intermedite frequency amplifying circuit 10 inputted to comparison circuit 11 is greater than the output level of first intermediate frequency amplifying circuit 6 and an output is generated at comparison circuit 11, amplified by amplifying element 12 thereby lighting display lamp 13 to indicate the intermodulation interference. In this case, volume control element 14 is regulated to increase the attenuation of attenuating circuit 2 and dampen the intermodulation interference input. In this case, if 1 db of signal is dampened by attenuating circuit 2, the output at first intermediate frequency amplifying circuit 6 can be reduced by 3 db.

Next, when two interfering signals enter through antenna 1 along with the desired signals and when the output level of first intermediate frequency amplifying circuit 6 caused by the desired signals is greater than the output level of second intermediate frequency amplifying circuit 10, the comparison circuit 11 has no output, and display lamp 13 does not light. The attenuation of attenuating circuit 2 need not be regulated. When the interference output is high, the output level of second intermediate frequency amplifying circuit 10 increases the intermodulation interference (because of the nonlinear circuit 8) and becomes greater than the output level of first intermediate frequency amplifying circuit 6. Comparison circuit 11 generates output signals which are amplified by amplifying element 12, and lights display lamp 13 indicating the presence of intermodulation interference. In this case, volume control element 14 is controlled to increase the dampening factor and reduce the output level of the interfering waves. Even when interference waves enter, the output of the interfering waves can be made zero by increasing by dampening factor of attenuating circuit 2, in which case display lamp 13 is turned off.

Even when interfering waves enter, the display lamp 13 does not light if the interfering wave output is reduced to zero by increasing the dampening factor of attenuating circuit 2. This results in the same display as in the case of no interfering wave input. Thus, when the dampening factor of attenuating circuit 2 is reduced to zero by changing over switch 15, the presence of an interfering wave input can be displayed.

Figure 5:
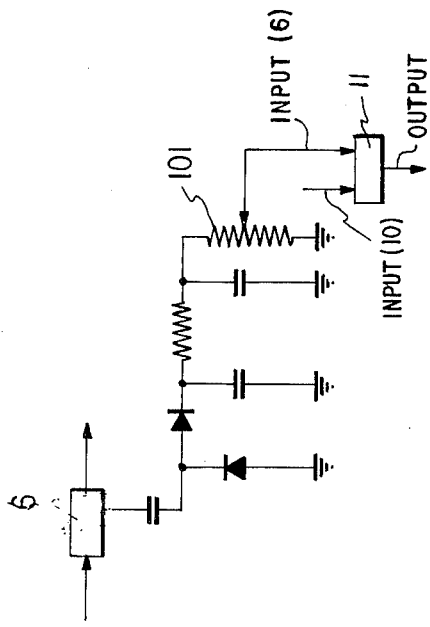
FIG. 5 is an illustrative rectifier circuit for use in the invention.

As indicated hereinbefore, the signals applied to comparison circuit 11 are D.C. signals obtained by rectifying the output signals from intermediate frequency (IF) amplifier 6 and 10 in all embodiments where the rectified output signals are obtained prior to amplitude limitation in FM receivers. An illustrative rectifier circuit is shown in FIG. 5. In FIG. 5, 101 is a varible resistor for adjusting the level of the output D.C. signal. Variable resistor 101 is optional, and not necessary for this rectifier circuit.

Figure 7:
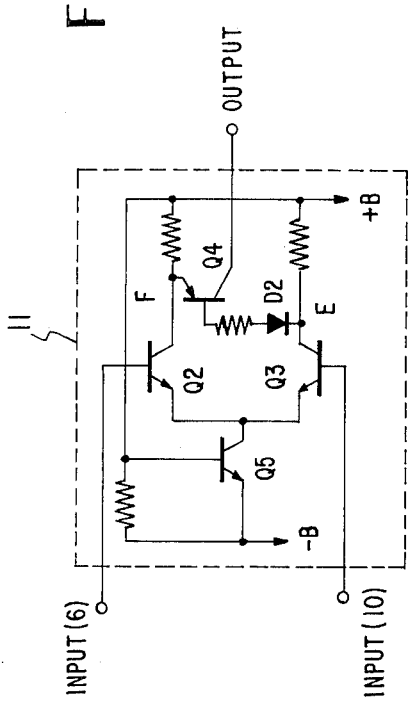
FIGS. 6 through 8 are illustrative comparison circuits for use in the invention.
Figure 8:
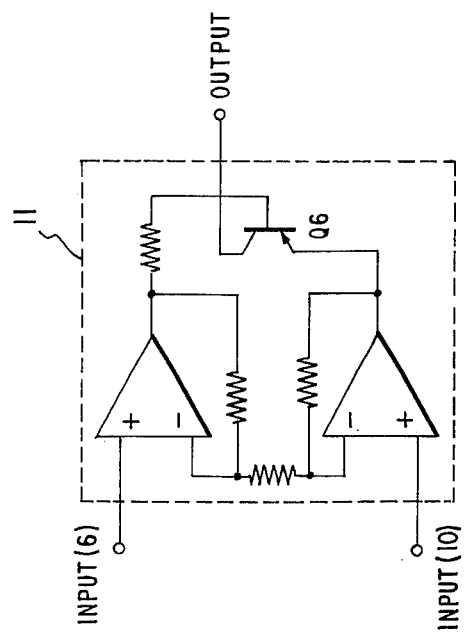
Figure 6:
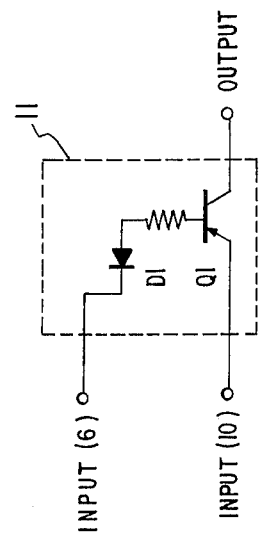

FIGS. 6–8 are circuit diagrams of various embodiments of comparison circuit 11. In these figures, INPUT (6) is connected to IF amplifier 6 through rectifier circuit 6a as described above and INPUT (10) is connected to IF amplifier 10 through rectifier circuit 10a. Also, OUTPUT is connected to transistor 12 in FIG. 1, to switching circuit 15 in FIG. 2, and to D.C. amplifier 16 in FIG. 3. In the comparison circuits to FIGS. 6–8, the output voltage that should be applied to transistor 12 in FIG. 1, for example, will appear when the input signal voltage level from INPUT (10) hereinafter referred to as "the level of INPUT (10)") is higher than that from INPUT (6) (hereinafter referred to as "the level of INPUT (6)").

The comparison circuit of FIG. 6 has a simple construction using one transistor Q1. In this circuit, diode D1 for protecting transistor Q1 is optional. In operation, transistor Q1 turns on when the level of INPUT (10) is higher than the level of INPUT (6). This means output voltage will appear at OUTPUT. In the other cases, transistor Q1 is off, which means output voltage will not appear at OUTPUT.

The comparison circuit of FIG. 7 uses a differential amplifier. Diode D2 is optional. In operation, if the level of INPUT (10) is higher than the level of INPUT (6), the voltage level at point E becomes lower than that at point F, and transistor Q4 turns on. Then, output voltage will appear at OUTPUT. In the other cases, transistor Q4 is off and output voltage will not appear at OUTPUT.

The comparison circuit of FIG. 8 uses two operational amplifiers. In operation, if the level of INPUT (10) becomes higher than the level of INPUT (6), transistor Q6 turns on and output voltage appears at OUTPUT. In the other cases, transistor Q6 is off, and the output voltage does not appear at OUTPUT.

As explained above, according to this invention, the device enables the reception of desired signals by identifying the input signals as desired signals when only desired signals occur and as interfereing signals when only interfering signals occur. When both signals occur simultaneously and when the intermodulation interference output is greater than the desired signal output, the device can reduce the interfering signal output by three times the desired signal output where the desired signal output may be reduced by only several db.

What is claimed is:

1. An intermodulation antiinterference circuit for a superheterodyne receiver having a receiving antenna comprising
   a first high frequency amplifying circuit responsive to the receiving antenna;
   a local oscillating circuit;
   a first frequency conversion circuit responsive to said first high frequency amplifying circuit and said local oscillating circuit;
   a variable attenuation circuit connected to said first high frequency amplifying circuit between said receiving antenna and said first frequency conversion circuit;
   a nonlinear circuit responsive to said receiving antenna having less linearity than said first high frequency amplifying circuit;
   a second frequency conversion circuit responsive to said local oscillating circuit and said nonlinear circuit;
   a comparison circuit responsive to said first and second frequency conversion circuits for generating an output when the output of said frequency conversion circuit is greater than the output of said first frequency conversion circuit; and
   means for changing the attenuation of said attenuating circuit in accordance with the output generated by said comparison circuit.

2. A circuit as in claim 1 where said nonlinear circuit is directly responsive to said receiving antenna.

3. A circuit as in claim 2 where said nonlinear circuit comprises a second high frequency amplifying circuit.

4. A circuit as in claim 1 where said nonlinear circuit is responsive to the output of said first high frequency amplifying circuit.

5. A circuit as in claim 1 where said attenuation circuit is disposed connected between said receiving antenna and said first high frequency amplifying circuit.

6. A circuit as in claim 1 where said means for changing the attenuation is manually operated.

7. A circuit as in claim 1 where said means for changing the attenuation includes means responsive to the output of said comparison circuit for automatically changing said attenuation.

8. A circuit as in claim 7 where said automatic changing means comprises a switching circuit for switching said attenuation circuit to one or the other of two predetermined settings.

9. A circuit as in claim 7 where said automatic changing means comprises a D.C. amplifying circuit responsive to said second frequency conversion circuit and said comparison circuit for continuously regulating said attenuation.

10. A circuit as in claim 1 including first and second intermediate frequency amplifying circuits respectively responsive to said first and second frequency conversion circuits, the linearity of said intermediate frequency amplifying circuit being no greater than that of said first intermediate frequency amplifying circuit, said comparison circuit being responsive to said first and second intermediate frequency amplifying circuits to generate said output therefrom when the output of said second intermediate frequency amplifying circuit is greater than the output of said first intermediate frequency amplifying circuit.

11. A circuit as in claim 10 where said superheterodyne receiver is a frequency modulation receiver and includes means for generating the outputs from said first and second intermediate frequency amplifying circuits prior to amplitude limitation thereof.

* * * * *